(12) United States Patent
Lee et al.

(10) Patent No.: US 6,215,149 B1
(45) Date of Patent: Apr. 10, 2001

(54) TRENCHED GATE SEMICONDUCTOR DEVICE

(75) Inventors: Sang-Hyun Lee, Goyang; Chang Sup Song, Seoul, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/376,762

(22) Filed: Aug. 17, 1999

(30) Foreign Application Priority Data

Aug. 18, 1998 (KR) ................................................ 98-33498

(51) Int. Cl.[7] .................................................. H01L 29/76
(52) U.S. Cl. ......................... 257/328; 257/302; 257/328; 257/382; 257/383; 257/388; 257/412; 257/413
(58) Field of Search .................................... 257/328, 382, 257/383, 388, 412, 413, 302

(56) References Cited

U.S. PATENT DOCUMENTS

| | | | |
|---|---|---|---|
| 5,710,438 | * | 1/1998 | Oda et al. ................................ 257/69 |
| 5,777,370 | * | 7/1998 | Omid-Zohoor et al. .............. 257/374 |
| 5,937,315 | * | 8/1999 | Xiang et al. ........................... 438/486 |
| 5,955,770 | * | 9/1999 | Chan et al. ............................ 257/408 |
| 5,962,904 | * | 10/1999 | Hu ......................................... 257/412 |
| 5,990,528 | * | 11/1999 | Sundaresan ........................... 257/393 |
| 6,025,620 | * | 2/2000 | Kimura et al. ........................ 257/296 |
| 6,054,744 | * | 4/2000 | Hu et al. ................................ 257/413 |

FOREIGN PATENT DOCUMENTS

404162563 * 6/1992 (JP) ..................................... 257/382

* cited by examiner

*Primary Examiner*—Mahshid Saadat
*Assistant Examiner*—Edgardo Ortiz
(74) *Attorney, Agent, or Firm*—Marger Johnson & McCollom, PC

(57) ABSTRACT

A semiconductor device having a trench type gate and a fabrication method therefor is provided. The semiconductor device includes a trench formed in a semiconductor substrate and a gate insulating layer formed on the inner walls of the trench. A gate fills the trench and is insulated from the semiconductor substrate by the gate insulating layer. A barrier layer is formed between the gate insulating layer and the gate for preventing migration of impurities from the gate to the gate insulating layer.

12 Claims, 3 Drawing Sheets

TRENCHED GATE SEMICONDUCTOR DEVICE

BACKGROUND OF THE INVENTION

1. Field of the Invention

The present invention relates to a semiconductor device and, more particularly, to a semiconductor device having a trench type gate and a fabrication method therefor.

2. Description of the Related Art

As the size and capacity of integrated semiconductor devices increases, the need for a power controlling semiconductor device having a high breakdown voltage, a high current, and high switching characteristics also increases. Such a power controlling semiconductor device should consume less power in a normal operating state and be small.

One commonly used power controlling semiconductor device is a dynamic metal oxide semiconductor field effect transistor (DMOSFET) adopting a general planar diffusion technology. More recently, however, MOSFET devices having a trench type gate in which a semiconductor substrate is etched to a predetermined depth to form a trench have attracted the attention of the industry. The trench is filled with a gate polysilicon.

FIG. 1 is a sectional view of a conventional power MOSFET having a trench type gate. In FIG. 1, an $N^+$ semiconductor substrate 10 is doped with a first conductive type impurity at a high concentration. An $N^-$ epitaxial layer 12 is formed on the substrate 10. A $P^-$ body region 14 is doped with a second conductive type impurity at a low concentration is formed on the $N^-$ epitaxial layer 12. An $N^+$ source region 16 is formed on the $P^-$ body region 14. A gate insulating layer 18 is formed on the $N^+$ source region 16. A gate 20 fills a trench (not shown). An interlayer dielectric (ILD) film 22 is formed on the gate insulating layer 18. A source electrode 24 is connected to the $N^+$ source region 16. A gate electrode 26 is connected to the trench type gate 20.

In a conventional device, to reduce signal delay in the gate, the trench is filled with highly doped polysilicon after forming a trench in a semiconductor substrate. Alternatively, after filling the trench with undoped polysilicon, the polysilicon is doped by soaking the device in phosphoryl chloride ($POCl_3$) solution or by implanting phosphorous (P) ions into the trench.

According to the conventional method for forming a gate, a large amount of ionized impurities e.g. phosphorous ions, working as positive charges, concentrate on the interface between a gate oxide layer and a polysilicon layer or in the gate oxide layer during its fabrication process. If a negative bias is applied under these conditions, leakage current in the gate oxide layer increases at a low voltage due to the ionized positive ions. This phenomenon occurs mostly in a power MOSFET adopting a thick gate oxide layer having a thickness greater than 300 A. This phenomenon becomes severe as the amount of ions accumulated in the gate oxide layer increases.

In particular, the oxide layer of a power MOSFET adopting a trench type gate thins at the corners of the trench. As a result, leakage current at low voltages increases when a negative bias is applied to a gate electrode thereby considerably lowering the reliability of the gate oxide layer.

SUMMARY OF THE INVENTION

It is an object of the present invention to provide a semiconductor device that overcomes the problems associated with prior art semiconductor devices.

It is another object of the present invention to provide a semiconductor device and a fabrication method therefor in which accumulation of ionized impurities in the interface between a gate insulating layer and a gate or in the gate insulating layer is suppressed thereby minimizing leakage current and improving the operating characteristics of the gate insulating layer.

It is yet another object of the present invention to provide a power semiconductor device and a fabrication method therefor capable of withstanding a high voltage.

The semiconductor device having a trench type gate includes a trench formed on a semiconductor substrate and a gate insulating layer formed on the trench. A gate is formed to fill the trench, the gate being insulated from the semiconductor substrate by the gate insulating layer. A barrier layer is formed between the gate insulating layer and the gate for preventing migration of impurities from the gate to the gate insulating layer. The gate is formed of polysilicon doped with impurities and the barrier layer is formed of a refractory metal. The refractory metal is titanium (Ti), vanadium (V), chromium (Cr), zirconium (Zr), niobium (Nb), molybdenum (Mo), hafnium (Hf), tantalum (Ta), or tungsten (W).

A silicide layer is formed between the gate and the barrier layer for reducing gate resistance. The silicide layer may be formed of a refractory metal, for example, titanium (Ti), vanadium (V), chromium (Cr), zirconium (Zr), niobium (Nb), molybdenum (Mo), hafnium (Hf), tantalum (Ta), or tungsten (W).

Another embodiment of the present invention is a power semiconductor device having a trench type gate. The power semiconductor device comprises a first conductivity type semiconductor substrate, a second conductivity type body region formed on the substrate, and a first conductivity type source region formed on the body region. A trench is formed through the source and body region. A gate is formed in the trench, the gate being insulated from the substrate by a gate insulating layer. A barrier layer is formed between the gate insulating layer and the gate for preventing migration of impurities from the gate to the gate insulating layer. An interlayer dielectric film is formed on the barrier layer. A gate electrode is connected to the gate via a contact hole formed in the interlayer dielectric film and a source electrode is connected to the source region via a contact hole formed in the interlayer dielectric film.

The gate is formed of polysilicon doped with impurities and the barrier layer is formed of a refractory metal. The refractory metal is titanium (Ti), vanadium (V), chromium (Cr), zirconium (Zr), niobium (Nb), molybdenum (Mo), hafnium (Hf), tantalum (Ta), or tungsten (W).

A silicide layer is formed between the gate and the barrier layer for reducing gate resistance. The silicide layer may also be formed of a refractory metal, for example, titanium (Ti), vanadium (V), chromium (Cr), zirconium (Zr), niobium (Nb), molybdenum (Mo), hafnium (Hf), tantalum (Ta), or tungsten (W).

A method for fabricating a semiconductor device having a trench type gate is provided. The method comprises forming a trench in a semiconductor substrate and forming a gate insulating layer on inner walls of the trench and on the semiconductor substrate. The method further comprises forming a barrier layer on the gate insulating layer and forming a gate electrode by filling the trench after forming the barrier layer. Forming the barrier layer includes forming the barrier layer of a refractory metal and wherein forming the gate includes forming the gate of polysilicon doped with impurities. Forming the barrier layer of a refractory metal includes forming the barrier layer of titanium (Ti), vanadium (V), chromium (Cr), zirconium (Zr), niobium (Nb), molybdenum (Mo), hafnium (Hf), tantalum (Ta), or tungsten (W).

Forming the gate comprises forming a polysilicon layer doped with impurities after forming the barrier layer and forming a silicide layer on the barrier layer by annealing the device after forming the polysilicon layer.

A method for fabricating a power semiconductor device having a trench type gate is provided. The method comprises forming a second conductivity type body region on a first conductivity type semiconductor substrate, forming a first conductivity type source region on the body region, and forming a trench in the semiconductor substrate. The method further comprises forming a gate insulating layer on the semiconductor substrate after forming the trench, forming a barrier layer on the gate insulating layer, and forming a gate by filling the trench after forming the barrier layer. The method also comprises forming an interlayer dielectric film after forming the gate, patterning the interlayer dielectric film thereby exposing the source region and the gate, and forming a source electrode connected to the source region and a gate electrode connected to the gate.

Forming the barrier layer includes forming the barrier layer of a refractory metal and wherein forming the gate includes forming the gate of a polysilicon doped with impurities. Forming the barrier layer of a refractory metal includes forming the barrier layer of titanium (Ti), vanadium (V), chromium (Cr), zirconium (Zr), niobium (Nb), molybdenum (Mo), hafnium (Hf), tantalum (Ta), or tungsten (W).

Forming the gate electrode comprises forming a polysilicon layer doped with impurities after forming the barrier layer and forming a silicide layer on the barrier layer by annealing the device after forming the polysilicon layer.

BRIEF DESCRIPTION OF THE DRAWINGS

The foregoing and other objects, features, and advantages of the invention will become more readily apparent from the following detailed description of a preferred embodiment that proceeds with reference to the following drawings.

DESCRIPTION OF THE PREFERRED EMBODIMENTS

Figure 1:
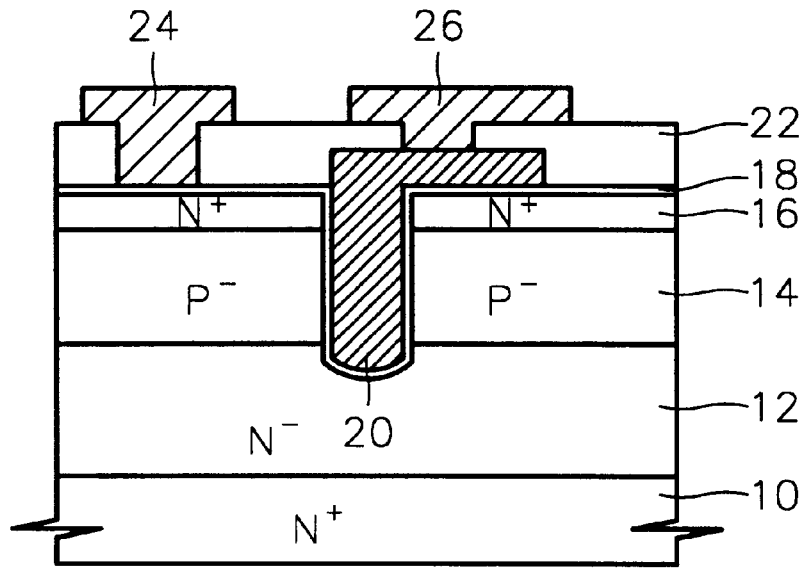
FIG. 1 is a section view of a conventional power metal oxide semiconductor field effect transistor (MOSFET) having a trench type gate.

The following fully describes the present invention with reference to the accompanying drawings. This invention may, however, be embodied in many different forms and should not be construed as being limited to the embodiments set forth herein. Rather, the embodiments set forth herein are provided to ensure a thorough disclosure and to fully convey the concepts of the invention to those skilled in the art. In the drawings, the thicknesses of layers and regions are exaggerated for clarity and the same reference numerals in different drawings represent the same elements. It will also be understood that when a layer is referred to as being "on" another layer or substrate, it can be formed directly on the other layer or substrate or intervening layers may also be present therebetween.

Figure 2:
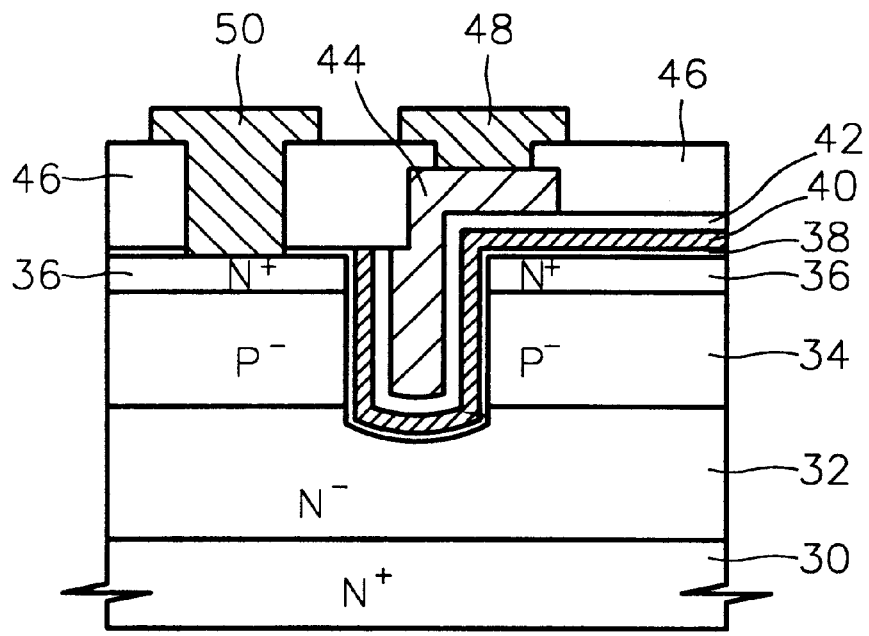
FIG. 2 is a section view of a semiconductor device having a trench type gate according to a preferred embodiment of the present invention.

FIG. 2 is a section view of a semiconductor device having a trench type gate according to a preferred embodiment of the present invention. The device shown is a power MOSFET. In this embodiment, first and second conductive types are defined N-type and P-type, respectively.

Referring to FIG. 2, an $N^+$ semiconductor substrate 30 and an $N^-$ epitaxial layer 32 are used as a base substrate. The semiconductor substrate 30 is highly doped with a first conductivity type impurity and the epitaxial layer 32 is lightly doped with a first conductivity type impurity. The epitaxial layer 32 is formed on the substrate 30. A second conductive type $P^-$ body region 34 is formed on the base substrate (substrate 30 and epilayer 32). An $N^+$ source region 36 highly doped with the first conductive type impurity is formed on the $P^-$ body region 34.

A trench is formed extending to a portion of the $N^-$ epitaxial layer 32 passing through the $N^+$ source region 36 and the conductive $P^-$ body region 34. A gate insulating film 38 is formed to cover the trench and the surface of the $N^+$ source region 36. A barrier layer 40, a silicide layer 42, and a gate 44 are stacked in sequence on the gate insulating layer 38.

The barrier layer 40 is formed of a refractory metal such as titanium (Ti), vanadium (V), chromium (Cr), zirconium (Zr), niobium (Nb), molybdenum (Mo), hafnium (Hf), tantalum (Ta), or tungsten (W). The barrier layer 40 prevents concentration of migrating positive ions from the gate 44 to the gate insulating layer 38 within the gate insulating layer 38. The gate 44 is formed, e.g., of an impurity-doped polysilicon. The silicide layer 42 formed between the barrier layer 40 and the gate 44 reduces resistance of the gate 44 improving the operating speed of the device. A gate electrode 48 and a source electrode 50 are connected to the gate 44 and the source region 36, respectively, via contact holes formed in an interlayer dielectric (ILD) film 46.

Figure 3:
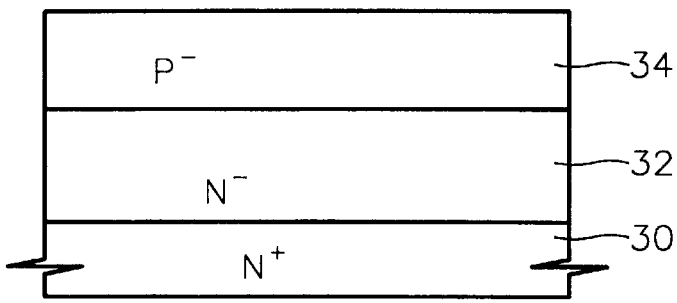
FIGS. 3 through 6 are section views illustrating a method for fabricating the semiconductor device having a trench type gate shown in FIG. 2.

FIGS. 3 through 6 are section views illustrating a method for fabricating the power MOSFET having a trench type gate shown in FIG. 2. Referring to FIG. 3, an $N^-$ epitaxial layer 32 is formed on a semiconductor substrate 30. The epitaxial layer 32 is doped with a low concentration of a first impurity type, e.g., an $N^-$ type. The substrate 30 is doped with a high concentration of a first impurity type, e.g., an $N^-$ type. A thin oxide layer (not shown) is formed on the $N^-$ epitaxial layer 32. The oxide layer serves as a buffer layer for reducing stress caused by different thermal expansion coefficients between a nitride layer acting as a mask, formed in a subsequent step, and the semiconductor substrate 30. In some cases, however, forming the oxide layer may be omitted.

An insulating layer (not shown), e.g. nitride layer, having an etching selectivity with respect to the oxide layer is formed on the entire surface of the oxide layer. The nitride layer and the oxide layer are patterned in sequence by general photolithography to form a nitride layer pattern (not shown) and an oxide layer pattern (not shown) each acting as a mask. Impurity ions having the opposite conductive type to the semiconductor substrate 30, e.g. P-type impurity, are implanted at a low concentration on the N⁻ epitaxial layer 32 using the nitride layer pattern as an ion implantation mask. The implanted impurity ions are diffused using a predetermined annealing process forming a P⁻ body region 34 on the N⁻ epitaxial layer 32.

Figure 4:
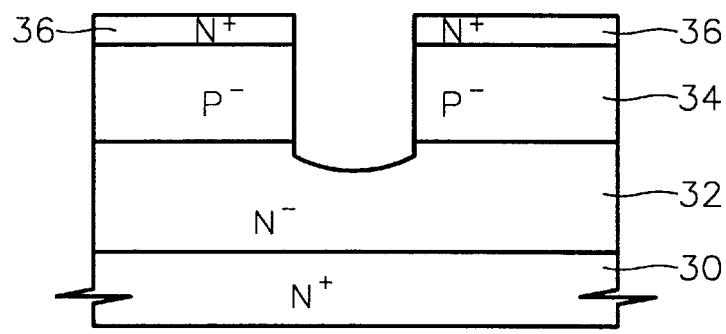

Referring to FIG. 4, an N⁺ source region 36 is formed on the P⁻ body region 34 by general photolithography and ion implantation processes. A photoresist pattern (not shown) that opens a trench region is formed by general photolithography. Using the photoresist pattern, etching is performed to a predetermined depth of the N⁻ epitaxial layer 32 passing through the N⁺ source region 36 and the P⁻ body region 34. This etching process forms a trench.

Figure 5:
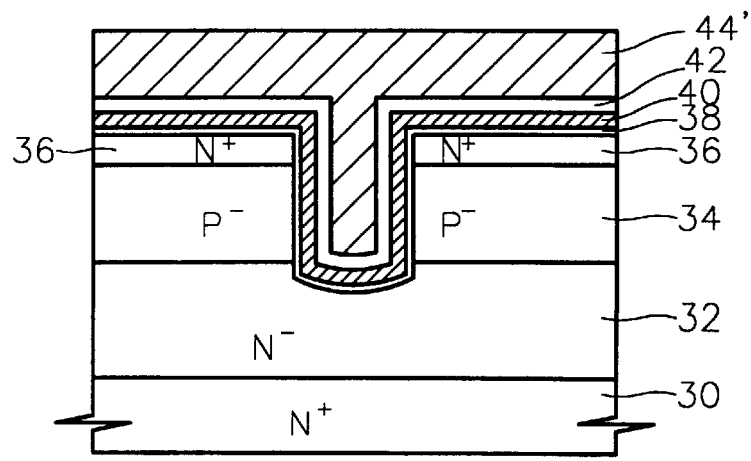

Referring to FIG. 5, a thin oxide layer is deposited on the entire surface of the resultant structure including the trench thereby forming in a gate insulating layer 38. A refractory metal, e.g., Ti, is deposited on the gate insulating layer 38 to a thickness of approximately 300 to 600 A. The refractory metal is deposited by general deposition such as sputtering, physical vapor deposition (PVD), or chemical vapor deposition (CVD) resulting in a barrier layer 40 that prevents migration of ions from a gate to be formed in a subsequent step to the gate insulating layer 38.

Then, a polysilicon layer 44' is formed on the barrier layer 40 filling the trench. The resultant structure is then annealed at a temperature higher than 800° C. in order to reduce resistance of the gate. The polysilicon layer 44, is highly doped with an N⁻ type impurity. Hence, a silicide layer 42, which is a compound between the refractory metal and silicon, is formed in the interface between the barrier layer 40 formed of the refractory metal and the polysilicon layer 44'. Where the trench is filled with undoped polysilicon, the resultant structure obtained after deposition of the polysilicon layer 44' is soaked in a phosphoryl chloride (POCl₃) solution to form the silicide layer. The polysilicon layer 44', the silicide layer 42, and the barrier layer 40 are then sequentially patterned.

Figure 6:
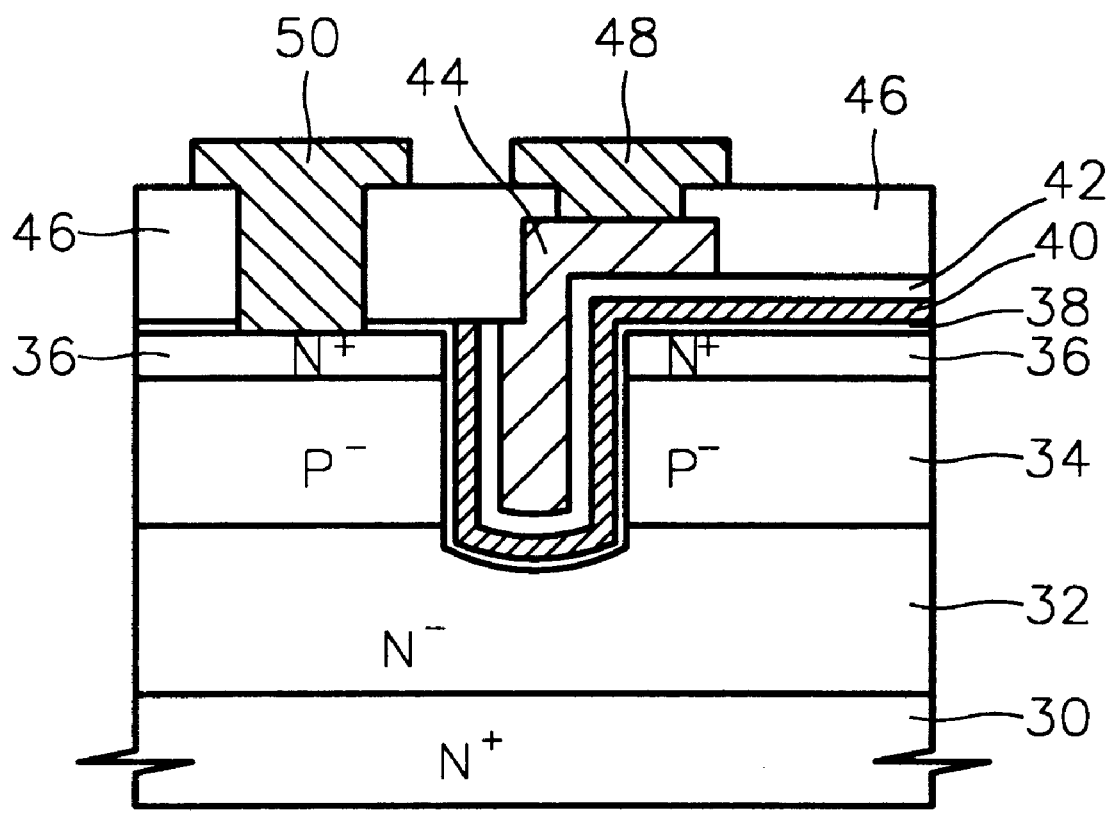

Referring to FIG. 6, an insulating layer such as phosphorous silicate glass (PSG) or boro-phosphorus silicate glass (BPSG) layer is deposited on the resultant structure having a gate 44, thereby forming an ILD film 46 for insulating a transistor from other conductive layers. The ILD film 46 is patterned by general photolithography forming contact holes exposing the source region 36 and the gate 44. The resultant structure is thermally treated to planarize the ILD film 46. The thermal treatment may be performed before the contact holes are formed.

A metal layer is deposited on the entire surface of the structure having the contact holes. The metal layer is then patterned by general photolithography forming a gate electrode 48 and a source electrode 50. The subsequent steps are the same as the steps of fabricating a general MOSFET.

The above embodiments have been described only for MOSFETS having an N⁺ source region. However, the present invention can be applied to MOSFETS having a P⁺ source region as well.

As described above, in the semiconductor device having a trench type gate and the fabrication method therefor, the barrier layer is formed between the gate insulating layer and the gate. Doing so suppresses accumulation of ionized impurities in the interface between the gate insulating layer and the gate or in the gate insulating layer thereby minimizing leakage current. Also, breakage of the gate insulating layer is prevented improving the operating characteristics of the gate insulating layer. Additionally, resistance of the gate by forming the silicide layer between the gate barrier and the gate is thereby reduced considerably decreasing delay of the gate signal.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A semiconductor device having a trench type gate, comprising:
   a trench having substantially upright vertical surfaces and a bottom surface formed on a semiconductor substrate;
   a gate insulating layer formed on the substantially upright vertical surfaces and the bottom surface inside the trench, the gate insulating layer forming a contiguous layer inside the trench;
   a barrier layer formed on the gate insulating layer inside the trench, the barrier layer forming a second contiguous layer inside the trench; and
   a gate formed on the barrier layer inside the trench, the gate being insulated from the semiconductor substrate by the gate insulating layer and impurities in the gate being prevented from migrating to the gate insulating layer by the barrier layer.

2. The semiconductor device of claim 1 wherein the gate is formed of polysilicon doped with impurities and the barrier layer is formed of a refractory metal.

3. The semiconductor device of claim 2 wherein the refractory metal is titanium (Ti), vanadium (V), chromium (Cr), zirconium (Zr), niobium (Nb), molybdenum (Mo), hafnium (Hf), tantalum (Ta), or tungsten (W).

4. The semiconductor device of claim 1 including a silicide layer formed between the gate and the barrier layer.

5. The semiconductor device of claim 4 wherein the silicide layer is formed of a refractory metal.

6. The semiconductor device of claim 5 wherein the refractory metal is titanium (Ti), vanadium (V), chromium (Cr), zirconium (Zr), niobium (Nb), molybdenum (Mo), hafnium (Hf), tantalum (Ta), or tungsten (W).

7. A power semiconductor device having a trench type gate, comprising:
   a first conductivity type semiconductor substrate;
   a second conductivity type body region formed on the substrate;
   a first conductivity type source region formed on the body region;
   a trench having substantially upright vertical surfaces and a bottom surface formed through the source and body regions;

a gate insulating layer formed on the substantially upright vertical surfaces and the bottom surface inside the trench, the gate insulating layer forming a first contiguous layer inside the trench;

a barrier layer formed on the gate insulating layer inside the trench, the barrier layer forming a second contiguous layer inside the trench;

a gate formed on the barrier layer inside the trench, the gate being insulated from the substrate by a gate insulating layer;

an interlayer dielectric film formed on the on the gate;

a gate electrode connected to the gate via a contact hole formed in the interlayer dielectric film; and a source electrode connected to the source region via a contact hole formed in the interlayer dielectric film.

8. The power semiconductor device of claim 7 wherein the gate is formed of polysilicon doped with impurities and the barrier layer is formed of a refractory metal.

9. The power semiconductor device of claim 8 wherein the refractory metal is titanium (Ti), vanadium (V), chromium (Cr), zirconium (Zr), niobium (Nb), molybdenum (Mo), hafnium (Hf), tantalum (Ta), or tungsten (W).

10. The power semiconductor device of claim 7 including a silicide layer formed between the gate and the barrier layer.

11. The power semiconductor device of claim 10 wherein the silicide layer is a refractory metal.

12. The power semiconductor device of claim 11 wherein the refractory metal is titanium (Ti), vanadium (V), chromium (Cr), zirconium (Zr), niobium (Nb), molybdenum (Mo), hafnium (Hf), tantalum (Ta), or tungsten (W).

* * * * *